US006891143B2

(12) United States Patent
Knee et al.

(10) Patent No.: US 6,891,143 B2
(45) Date of Patent: May 10, 2005

(54) PHOTO-SENSOR ARRAY WITH PIXEL-LEVEL SIGNAL COMPARISON

(75) Inventors: Derek L. Knee, Ft. Collins, CO (US); Thomas C. Oliver, Windsor, CO (US)

(73) Assignee: Microsoft Corporation, Redmond, WA (US)

(*) Notice: Subject to any disclaimer, the term of this patent is extended or adjusted under 35 U.S.C. 154(b) by 350 days.

(21) Appl. No.: 10/283,264

(22) Filed: Oct. 30, 2002

(65) Prior Publication Data

US 2004/0085468 A1 May 6, 2004

(51) Int. Cl.[7] ............................................. H01L 27/00
(52) U.S. Cl. .................... 250/208.1; 348/297; 348/301; 348/302; 348/308; 348/310
(58) Field of Search .................... 250/208.1, 214.1, 250/214 R; 348/297, 300–302, 307–310

(56) References Cited

U.S. PATENT DOCUMENTS

| | | | |
|---|---|---|---|
| 5,461,425 A | 10/1995 | Fowler et al. | |
| 5,801,657 A | 9/1998 | Fowler et al. | |
| 6,172,354 B1 | 1/2001 | Adan et al. | |
| 6,271,785 B1 | 8/2001 | Martin et al. | |
| 6,303,924 B1 | 10/2001 | Adan et al. | |
| 6,707,410 B1 * | 3/2004 | Bock | 341/155 |
| 6,756,576 B1 * | 6/2004 | McElroy et al. | 250/208.1 |
| 6,757,018 B1 * | 6/2004 | Fowler | 348/301 |
| 2003/0030738 A1 * | 2/2003 | Clynes et al. | 348/308 |
| 2004/0051802 A1 * | 3/2004 | Krymski | 348/308 |

OTHER PUBLICATIONS

Xavier Arreguit et al., "A CMOS Motion Detector System for Pointing Devices," ISSCC96 Array Processors ad Image Based Sensors, Paper TP/64.

Xavier Arreguit et al., "A CMOS Motion Detector System for Pointing Devices," IEEE J. of Solid State Circuits, vol. 31, No. 12, pp. 1916–1921, Dec. 1996.

Rafael Dominguez–Castro et al., "A 0.8 μm CMOS Two–Dimensional Programmable Mixed–Signal Focal–Plane Array Processor with On–Chip Binary Imaging and Instructions Storage," IEEE J. of Solid State Circuits, vol. 32, No. 7, pp. 1013–1026, Jul. 1997.

Stuart Kleinfelder et al., "A 10 000 Frames/s CMOS Digital Pixel Sensor," IEEE J. of Solid State Circuits, vol. 36, No. 12, pp. 2049–2059, Dec. 2001.

Nicolo Mamaresi et al., "A CMOS–Only Micro Touch Pointer," J. Of Solid State Circuits, vol. 34, No. 12, pp. 1860–1868, Dec. 1999.

O. Schrey et al., "A Logically Adaptive CMOS Image Sensor with 90dB Dynamic Range," IEEE Int'l Solid State Circuits Conference, WA–17.6 (1999).

G. Torelli et al., "Analog–to–Digital Conversion Architectures for Intelligent Optical Sensor Arrays," SPIE vol. 2950, pp. 254–264 (Aug. 1996).

David Yang et al., "A 640×512 CMOS Image Sensor with Ultra Wide Dynamic Range Floating–Point Pixel–Level ADC," Session No. 17, Nov. 1, 1998.

David Yang et al., "A 640×512 CMOS Image Sensor with Ultra Wide Dynamic Range Floating–Point Pixel–Level ADC," IEEE J. Solid State Circuits, vol. 34, No. 12, Dec. 1999.

David Yang et al., "A Nyquist–Rate Pixel–Level ADC for CMOS Image Sensors," IEEE J. Solid State Circuits, vol. 34, No. 3, Mar. 1999.

* cited by examiner

Primary Examiner—David Porta
Assistant Examiner—Davienne Monbleau
(74) Attorney, Agent, or Firm—Banner & Witcoff, Ltd.

(57) ABSTRACT

Pixels in an array of image sensor pixels contain photo-sensors. In response to illumination of a photo-sensor, an initial signal is generated. Multiple comparison signals are also generated based on the initial signal. One of the comparison signals remains internal to the pixel, and other comparison signals are transmitted to neighboring pixels. Within a pixel, the internal comparison signal is compared to a sum of comparison signals received from neighboring pixels. Based on the comparison, a data value may be latched and used for indicating a relative difference in pixel illumination.

36 Claims, 11 Drawing Sheets

PHOTO-SENSOR ARRAY WITH PIXEL-LEVEL SIGNAL COMPARISON

FIELD OF THE INVENTION

This invention relates to processing of output from photo-sensors as part of an imaging system, and more specifically, to an array of analog photo-sensors that provide DC removal processing at the pixel level.

BACKGROUND OF THE INVENTION

Photo-sensitive electronic components can be used to create electronic imaging systems, including systems for detecting and measuring motion. When used for motion detection, obtaining a highly detailed image of an area or object may be less important than determining whether a particular image reflects a change by comparison to a prior image. In turn, this may place higher importance upon contrast between neighboring image elements.

One application for motion detection is a computer pointing or input device, such as a computer mouse. Use of electronic imaging for such purposes is described in, e.g., U.S. Pat. No. 6,303,924 (titled "Image Sensing Operator Input Device") and U.S. Pat. No. 6,172,354 (titled "Operator Input Device"). As described in those patents, an array of photo-sensitive elements generates an image of a desktop (or other surface) when light from an associated illumination source (such as a light emitting diode) reflects from the desktop or other surface. Subsequent images are compared, and based on the correlation between images, the magnitude and direction of mouse (or other device) motion may be determined.

FIG. 1 shows a pixel within a photo-sensor array architecture used in existing computer input devices. Each pixel of the photo-sensor array includes a photo-sensor 10, which may be a photodiode or other photosensitive component. Prior to obtaining an image, a RESET signal on NMOS transistor 12 allows node INT to be charged to a reference voltage $V_{ref}$. When the RESET signal is not asserted, light reflected from a desktop or other surface illuminates photo-sensor 10, thereby permitting a reverse bias current to flow to ground through photo-sensor 10. Node INT is then discharged as a result of the reverse bias current through photo-sensor 10. Higher intensity (or brighter) light, which may correspond to a more reflective object or surface feature, allows a greater reverse bias current through photo-sensor 10, and thus a more rapid discharge of node INT. Conversely, lower intensity (or dimmer) light, which may correspond to reflection from a darker object or surface feature, allows a smaller reverse bias current through photo-sensor 10, and a less rapid discharge of node INT. The voltage on node INT controls the gate of NMOS transistor 14; as the charge on node INT is drained, the correspondingly decreasing bias on NMOS 14 causes a drop in the voltage at node 16. At a designated point in time, a SELECT signal is applied on the gate of NMOS 18, permitting a charge to accumulate on storage capacitor 20. The voltage across NMOS 14 varies with the gate voltage on NMOS 14, which in turn varies with intensity of illumination upon photo-sensor 10. Thus, the magnitude of the accumulated voltage on storage capacitor 20 relates to the magnitude of the illumination upon photo-sensor 10. Because the intensity of the reflected illumination will vary based upon surface features of a desk or other surface, this charge on storage capacitor 20 can be used (as part of an array of photo-sensor pixels) to detect and measure changes of position with regard to that desk or other work surface.

The voltage on each capacitor in the array is passed through a multiplexer (MUX) to an Analog to Digital Converter (ADC). The ADC outputs digital values corresponding to the voltages on the storage capacitors, which represent the relative intensity of illumination upon the photo-sensors in the array. These digital values are then passed through a digital DC Removal (DCR) process to enhance the image contrast and to reduce the number of storage elements needed to store the resultant image. A subsequent Correlator compares the DCR processed image data with prior DCR processed image data, and produces navigation data reflecting the magnitude and direction of device motion.

In the example of FIG. 1, a separate storage capacitor is required to store the value for each photo-sensor in the array. Storage capacitors are typically located on each side of the array, and require a relatively large amount of area on an Integrated Circuit (IC). This architecture is also susceptible to parasitic signal couplings, capacitor leakages and charge injections, and can only store an image without corruption for a relatively short time. Moreover, this architecture presents problems with regard to digitally-oriented Application Specific Integrated Circuit (ASIC) technologies, which may involve high sub-threshold leakages and low power supply voltages.

In an architecture such as shown in FIG. 1, the ADC function and subsequent DCR processing is all performed in a bit-wise serial fashion, i.e., one pixel at a time. Because each pixel value from the ADC may be multiple bits in length, significant digital circuitry may be required to DCR process all pixel values. This additional circuitry requires additional IC area, which increases cost. This processing must also occur quickly (on the order of 100 μseconds). For high speed applications (such as detection of movements of a computer mouse), a high speed ADC is required to serially perform the conversion for each pixel, as well as high speed digital circuitry to serially enhance pixel contrast. Significant digital memory may also be required to store multibit data for each pixel. Although it is possible to implement multiple ADCs and other digital circuitry components to parallel process multiple pixels, the multiple components required for parallel processing must have matched properties. Such parallel processing also increases power requirements.

Accordingly, there remains a need for improved electronic image processing systems for motion detection.

SUMMARY OF THE INVENTION

A photo sensor pixel according to the invention provides DC Removal (DCR) and contrast enhancement signal processing in the analog domain at the pixel level. By performing DCR at the pixel level, separate (i.e., off-pixel) Analog to Digital Conversion (ADC) and DCR processing are no longer necessary. In one embodiment, each pixel cell generates a single bit of DCR processed ("DCRed") image data. The pixel bit values can then be stored in memory for image correlation processing at any desired time. In other embodiments, one or more additional bits may be provided for each pixel. A two dimensional array of pixels according to the invention reduces the storage requirements of the overall image processing chip.

A pixel cell according to the invention allows reduction in the analog and digital circuitry of an array of pixel cells. The analog circuitry of the pixel also facilitates incorporation of an array of such pixels into newer digitally-oriented Application Specific Integrated Circuit (ASIC) technologies having lower supply voltages. A pixel cell according to the invention may also reduce chip cost and testing time. Moreover, the reduced design complexity of the pixel's analog circuitry is generally less sensitive to sub-threshold leakage and gate leakage sometimes associated with modern digital ASICs. The pixel cell may also consume less static supply current, allowing longer battery life when used in battery powered devices. Switching currents may also be reduced by operating at lower clock rates than those needed for traditional approaches such as, e.g., high-speed serial processing.

The invention may include an array of photo-sensor pixel cells, wherein each pixel cell includes analog circuitry to generate an initial signal in response to radiation illuminating that pixel. The magnitude of the initial signal varies with the intensity of illumination. In one embodiment, the initial signal is a current. Each pixel then creates multiple comparison signals based on its initial signal, and transmits a comparison signal to each of several neighboring pixels. Multiple pixels within the array receive comparison signals from their respective neighboring pixels. Each receiving pixel sums the comparison signals received from its neighbors. The summed signals are then compared with an internal comparison signal. The result of that comparison may then be used to store a digital data value representing DCR-processed image data for that pixel.

The above and other features and advantages of the present invention will be readily apparent and fully understood from the following detailed description of preferred embodiments, taken in connection with the appended drawings.

DETAILED DESCRIPTION OF THE PREFERRED EMBODIMENTS

Figure 2:
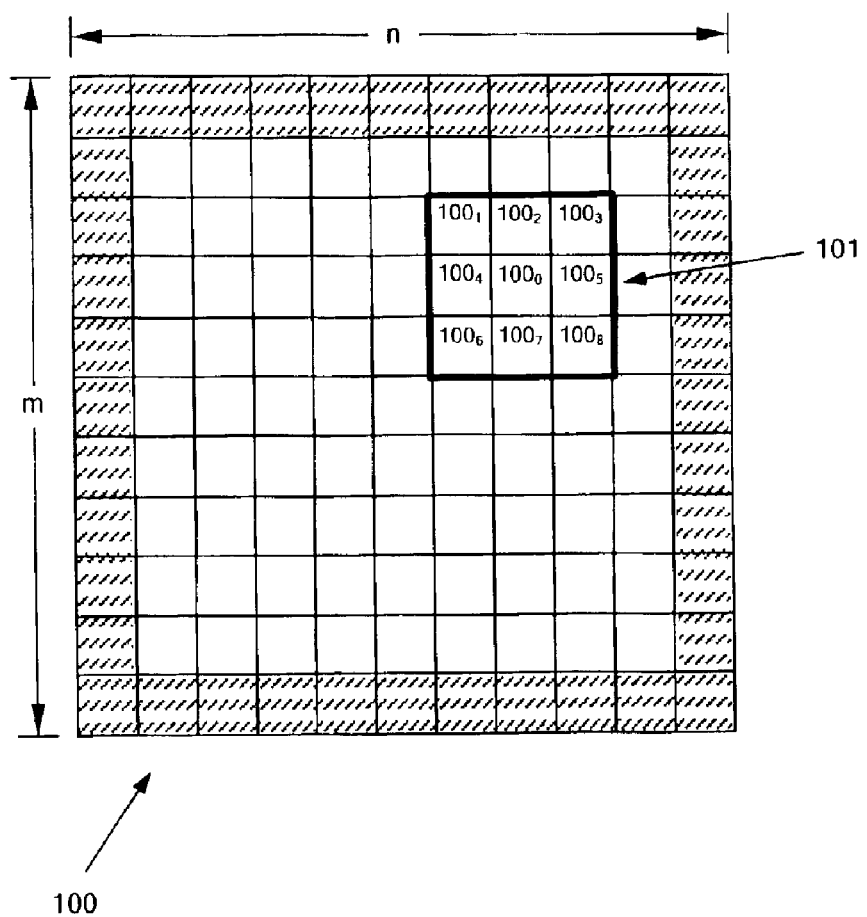
FIG. 2 is a block diagram of a pixel array according to one embodiment of the invention.

FIG. 2 is a block diagram of an array 100 having m rows and n columns of pixels. Array 100 (which could be formed as part of an integrated circuit) may form part of an electronic imager. In operation, array 100 may be configured to receive light reflected from a surface (or object), and thereby generate an image of the surface (or object). Array 100 is in communication with a controller device (e.g., additional circuitry on the same IC, not shown, and/or one or more separate processors, also not shown). Except as set forth below, the details of such components are not necessary for an understanding of the invention. Hardware and software (or firmware) suitable for implementation of a photo-sensor array of the invention will be apparent to one of ordinary skill in the art from the information provided herein.

Highlighted in FIG. 2 is a sub-array 101 of 9 contiguous pixels, labeled $100_0$ through $100_8$, at an arbitrary location within array 100. Except as set forth below, the pixels in sub-array 101 are generally representative of other non-edge pixels in array 100. Edge pixels (shown with cross-hatching in FIG. 2) are similar to non-edge pixels, but may lack certain circuitry and functions, as explained more fully below. In operation, a non-edge pixel in array 100 compares its output with the output of neighboring pixels. Based on that comparison, a data bit (or bits) representing DCR processed image data is stored for the pixel. In one embodiment, the pixel latches a value of "1" if the output of the pixel exceeds a value based upon the outputs of the eight nearest neighboring pixels. Otherwise, that pixel latches a value of "0". In other words, and using pixels $100_0$ through $100_8$ as an example, center pixel $100_0$ is assigned a value of 1 if Expression 1 is true:

Expression 1:

$$S(100_0) > \frac{\alpha_1 S(100_1) + \alpha_2 S(100_2) + \alpha_3 S(100_3) + \alpha_4 S(100_4) + \alpha_5 S(100_5) + \alpha_6 S(100_6) + \alpha_7 S(100_7) + \alpha_8 S(100_8)}{\alpha_0}$$

where:

$S(100_i)$ is an analog output signal of pixel $100_i$; and $\alpha_i$ is a gain (or attenuation) associated with pixel $100_i$.

Table 1 provides one example of gain values applied by each pixel in a 3×3 sub-array such as sub-array 101 when performing the DCR function according to Expression 1.

TABLE I

| | | |
|---|---|---|
| $\alpha_1 = -1$ | $\alpha_2 = -1$ | $\alpha_3 = -1$ |
| $\alpha_4 = -1$ | $\alpha_0 = +8$ | $\alpha_5 = -1$ |
| $\alpha_6 = -1$ | $\alpha_7 = -1$ | $\alpha_8 = -1$ |

The values in Table 1 are merely examples of possible gain values that may be applied; other values of gain (or attenuation) are within the scope of the invention. Indeed, an array of pixels according to the invention may be implemented with numerous combinations of desired values, thus allowing for many different DCR filter transformations. Additional examples include, but are not limited to, the values shown in Table 2 and Table 3:

TABLE 2

| | | |
|---|---|---|
| $\alpha_1 = -2$ | $\alpha_2 = -2$ | $\alpha_3 = -2$ |
| $\alpha_4 = -2$ | $\alpha_0 = +16$ | $\alpha_5 = -2$ |
| $\alpha_6 = -2$ | $\alpha_7 = -2$ | $\alpha_8 = -2$ |

TABLE 3

| | | |
|---|---|---|
| $\alpha_1 = -1$ | $\alpha_2 = -2$ | $\alpha_3 = -1$ |
| $\alpha_4 = -2$ | $\alpha_0 = +12$ | $\alpha_5 = -2$ |
| $\alpha_6 = -1$ | $\alpha_7 = -2$ | $\alpha_8 = -1$ |

Figure 3:
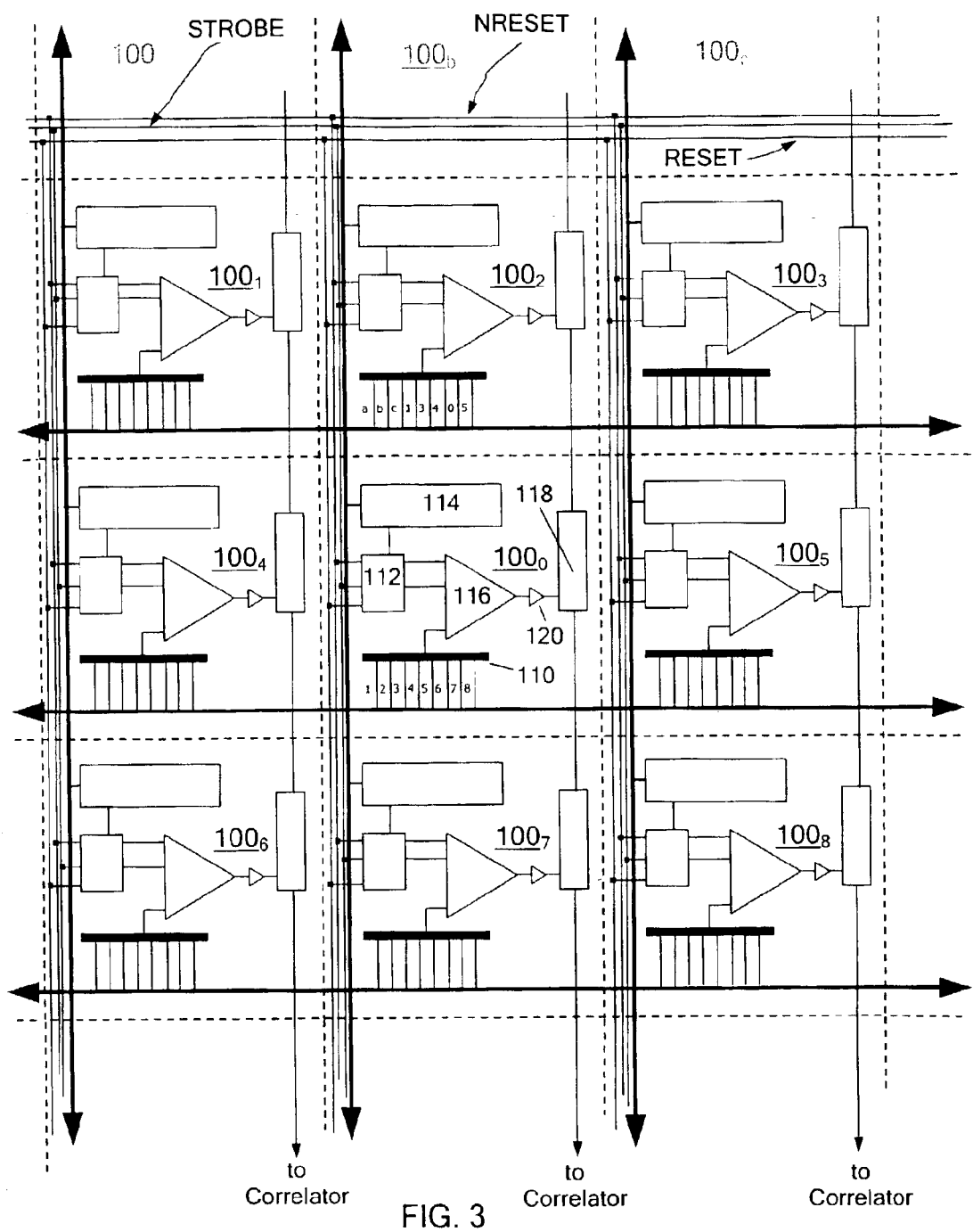
FIG. 3 is a block diagram of a portion of the pixel array of FIG. 2.

FIG. 3 is an enlarged block diagram of pixels $100_0$–$100_8$ of sub-array 101. Pixel $100_0$, at the center of sub-array 101, is surrounded by eight nearest neighboring pixels $100_1$–$100_8$. Each pixel of sub-array 101 includes a current summing node 110; integration circuitry 112; comparison current generator circuitry 114; comparator circuitry 116; a serially scanned latch 118; and a buffer 120. So as not to unnecessarily obscure the drawing, the components of all pixels in FIG. 3 are not labeled, with the components of other pixels in sub-array 101 being substantially similar. However, the inputs to each pixel's current summing node will be different. As shown in FIG. 3, current summing node 110 of pixel $100_0$ has eight inputs, one from each of the eight nearest neighboring pixels. In particular, input "1" is an input from pixel $100_1$, input "2" is an input from pixel $100_2$, etc. Similarly, and referring to the pixels directly above pixels $100_1$ through $100_3$ as "$100_a$," "$100_b$," and "$100_c$," the inputs to the current summing node of pixel $100_2$ would correspond to pixels $100_a$, $100_b$, $100_c$, $100_1$, $100_3$, $100_4$, $100_0$ and $100_5$ (or a, b, c, 1, 3, 4, 0 and 5, as shown in FIG. 3). The inputs to the current summing nodes of other pixels could follow a similar pattern. The large bold arrows in FIG. 3 only represent possible paths by which outputs from a pixel may be routed to that pixel's neighboring pixels, and are not intended to represent connections from each pixel to each other pixel in the array. As set forth in more detail below, edge pixels in array 100 may not perform all functions performed by non-edge pixels such as those within sub-array 101, and thus may lack certain of the components shown in FIG. 3.

Figure 4:
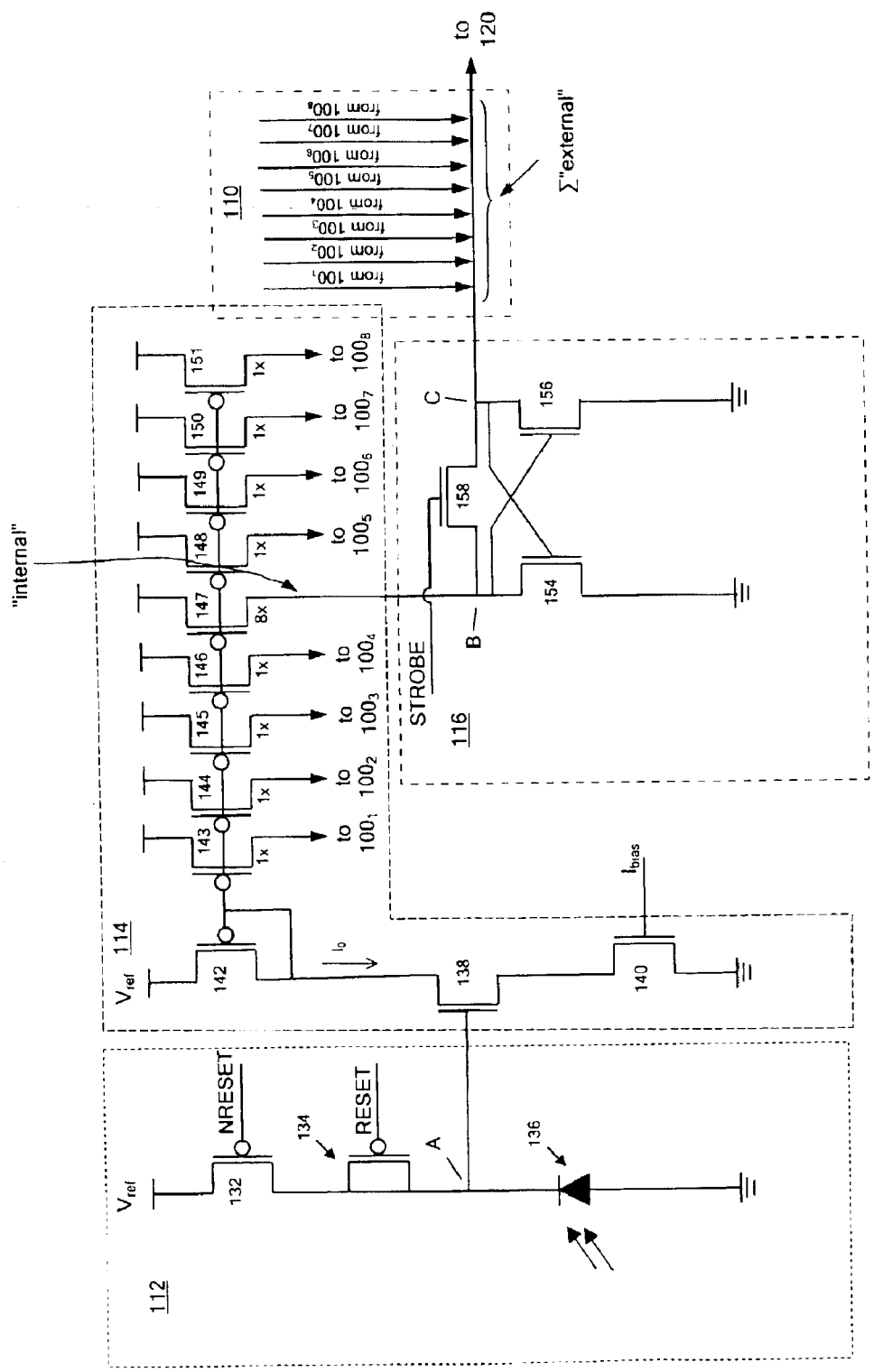
FIG. 4 is a schematic diagram of a pixel of FIG. 3.

FIG. 4 is a more detailed schematic diagram for pixel $100_0$. As with the block diagram of FIG. 3, a schematic diagram for other non-edge pixels in array 100 would be substantially the same, but would have different inputs to the current summing node 110 of each pixel. Components corresponding to integration circuitry 112 in FIG. 3 are enclosed within the broken-line box labeled 112 in FIG. 4. Similarly, components corresponding to the comparison current generator circuitry 114, comparator circuitry 116 and current summing node 110 in FIG. 3 are also enclosed within correspondingly-labeled boxes in FIG. 4. The details of the serially scanned output latch 118 and the buffer 120 are not shown. Details of circuitry and components for such a latch and a buffer are within the knowledge of a person skilled in the art once that person is provided with the information contained herein, and are thus not necessary for understanding the present invention. Integration circuitry 112 includes PMOS devices 132 and 134 and a photodiode 136. Devices 132 and 134 form a charge-cancelled switch to precharge node A to reference voltage $V_{ref}$. As is also described in more detail below, light falling on photodiode 136 permits a reverse-bias current to flow through photodiode 136, thereby discharging node A and reducing the integration voltage ($V_{int}$) at node A. The amount by which node A is discharged (and $V_{int}$ is decreased) during the Integration stage modulates an initial current $I_0$ through an initial current generator formed by NMOS devices 138 and 140 and PMOS device 142. The maximum magnitude of current $I_0$ is regulated by NMOS device 140, which may be a long channel length device which emulates a linear resistor. Using current $I_0$ as a reference, multiple comparison currents (which may have different magnitudes) are generated by the comparison current generator formed by PMOS reference device 142 and the PMOS mirroring devices 143–151. As shown in FIG. 4, and by appropriate device sizing within the PMOS comparison current generator, eight comparison currents are generated at a magnitude of 1 times (1×) $I_0$ (corresponding to $\alpha_1$ through $\alpha_8$), and one comparison current is generated at a magnitude of 8 times (8×) $I_0$ (corresponding to $\alpha_0$). As seen by comparing Table 1 and Expression 1 with FIG. 4, these values of the comparison currents provide the gain values for pixel $100_0$ set forth in Table 1. Alternatively, the devices within the pixels could be sized so as to provide the gain values shown in Table 2 or Table 3, or to provide other desired values. The gain/attenuation values may be the same for each pixel, or may vary among pixels of the array. By choosing appropriate components, a large choice of comparison thresholds is available.

As shown in FIGS. 3 and 4, each of the 1× comparison currents is fed to the current summing node of one of neighboring pixels $100_1$, $100_2$, $100_3$, $100_4$, $100_5$, $100_6$, $100_7$ and $100_8$. The "internal" (i.e., originating within pixel $100_0$) 8× comparison current from PMOS device 147 is fed to current mode comparator circuitry 116 of pixel $100_0$. Comparator circuitry 116 includes a composite charge cancellation device 158 (shown as a single NMOS in FIG. 4) and matched NMOS devices 154 and 156. The signal STROBE holds comparator 116 in a balanced state when the STROBE signal is high. A 1× "external" (i.e., originating from a neighboring pixel) comparison current from the comparison current generator of each neighboring pixel is fed to, and summed at, current summing node 110 of pixel $100_0$. Current summing node 110 is also coupled to latch 118 (not shown) through buffer 120 (also not shown). When the STROBE signal transitions from high to low, comparator 116 compares the internal 8× comparison current with the sum of the external 1× comparison currents from each of the eight neighboring pixels. If the internal 8× comparison current is higher than the sum of the eight external comparison currents, the external comparison currents are grounded through NMOS device 156, and the signal to latch 118 is low. If, however, the internal 8× comparison current is lower than the summed external comparison currents, the summed currents are not completely grounded, and the signal to latch 118 is high.

In the above embodiment, an array of m pixels by n pixels is reduced to an array of m-2 by n-2 pixel data values. Pixels on the outside edges of array 100 (see FIG. 2) provide 1× comparison currents to neighboring pixels that are not on the edges, but edge pixels do not compare an 8× version of their own initial currents with summed currents from neighboring pixels, and image data is not stored for the edge pixels. As one example, if n=20 and m=20, array 100 is a 400 pixel array, but only generates 324 data bits for each image (i.e., (20-2)×(20-2)). Because edge pixels do not perform comparison or latching functions, the circuitry for those functions can be omitted. In alternate embodiments, edge pixels could be configured to perform the comparison and latching functions, but according to a modified version of the comparison expression used in non-edge pixels. An example of possible gain values for such a modified expression are shown in Table 4.

TABLE 4

| | | |
|---|---|---|
| $\alpha_1 = 0$ | $\alpha_2 = -1$ | $\alpha_3 = -1$ |
| $\alpha_4 = 0$ | $\alpha_0 = +5$ | $\alpha_5 = -1$ |
| $\alpha_6 = 0$ | $\alpha_7 = -1$ | $\alpha_8 = -1$ |

In the example of Table 4, $\alpha_0$ corresponds to a pixel at an intermediate left edge location on FIG. 2 (i.e., not on a corner). Because there are no pixels to the left of the pixel, $\alpha_1$, $\alpha_4$ and $\alpha_6$ are 0.

Figure 1:
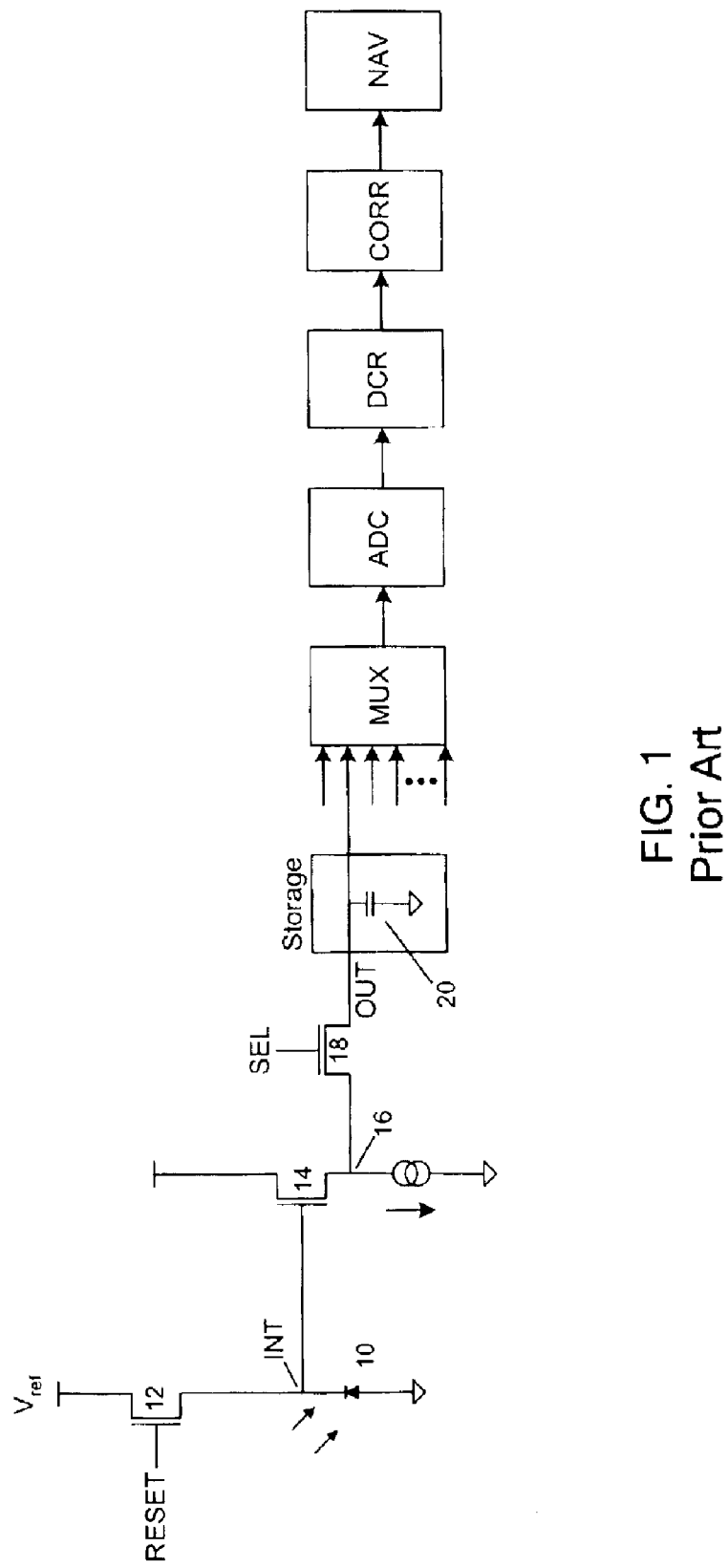
FIG. 1 is a block diagram of an existing photo-sensor architecture used for motion detection.

FIGS. 3 and 4 illustrate at least one advantage of the invention over architectures such as that shown in FIG. 1. Instead of converting each pixel value to a multi-bit digital value and then performing DCR processing on the digital values, the DC Removal is now achieved in the analog domain within each pixel. Each pixel performs its DCR processing in parallel, eliminating the need for high speed digital signal processing on each pixel in a serial fashion. Each non-edge pixel generates a high or low signal which is latched when the STROBE signal is low. This latching, which may also occur within each pixel, is also performed simultaneously on all non-edge pixels in the array. When the STROBE signal is low, the voltage a Node C within each non-edge pixel is held at a high or low value based upon a comparison with currents received from neighboring pixels. This high or low voltage is passed through each pixel's buffer 120 to the pixel's latch 118 and stored as a single bit value. When the STROBE signal is high, the comparator 116 is in balanced state, and the voltage at Node C will be at an intermediate value. Because unpredictable results could occur by inadvertent latching of such an intermediate value, buffer 120 may have a skewed threshold so as to prevent a voltage signal below that threshold from reaching latch 118.

Figure 5:
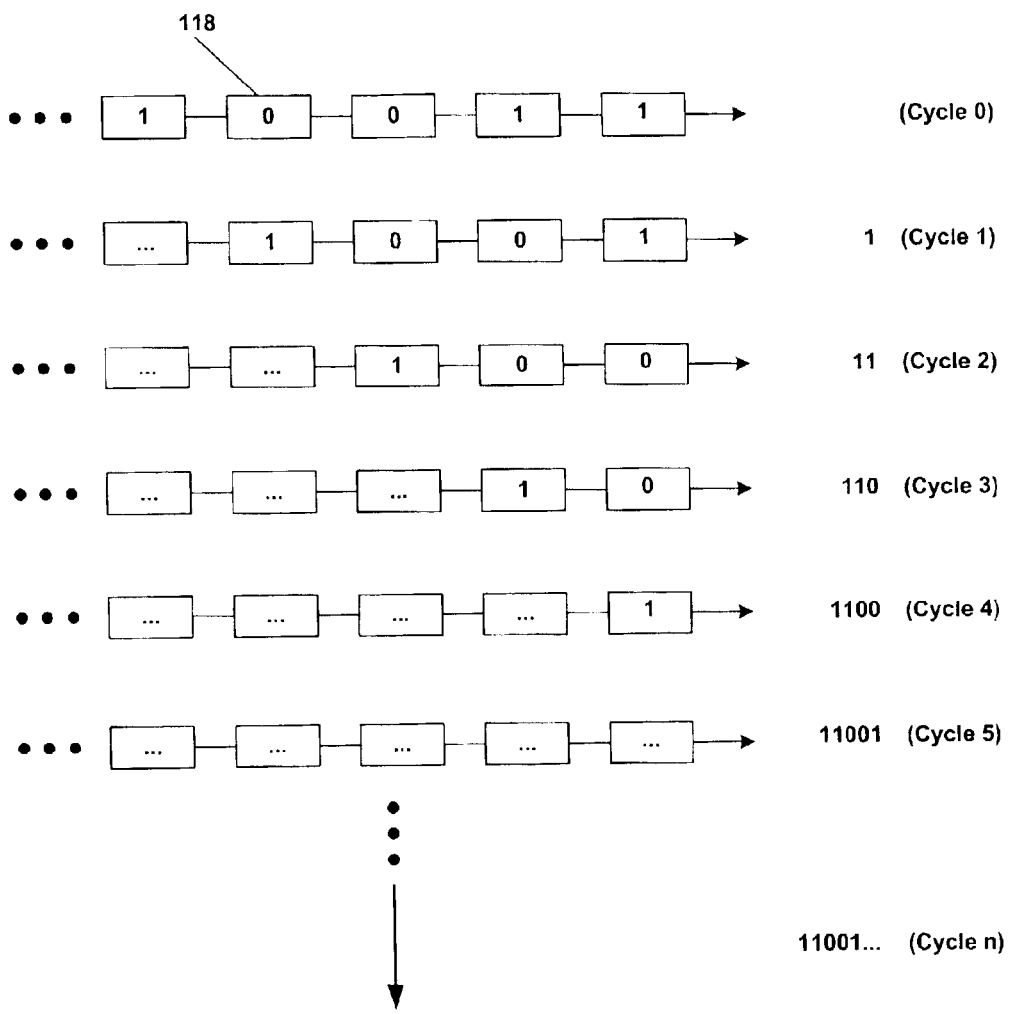
FIG. 5 is a block diagram illustrating serial data readout in one embodiment of the invention.

After all the comparator outputs are latched, the latched values for each pixel row are concatenated into a scan chain, and a scan clock signal then causes the scan chain for each row to be serially read into a memory (not shown in the drawings) for subsequent correlation with prior image data. The memory and correlation circuitry (also not shown) may be outside of array 100. FIG. 5 illustrates one possible configuration and method for reading data for each pixel in a row (or column) of array 100. FIG. 5 shows, in block form for multiple clock cycles, five latches $118_i$, in a row of pixels in array 100. By way of example, the 5 latches could represent latches $118_a$, $118_2$, $118_0$ and $118_7$ (corresponding to pixels $100_a$, $100_2$, $100_0$ and $100_7$, respectively) in FIG. 3, together with an additional latch from the pixel immediately above pixel $100_a$ or the pixel immediately below pixel $100_7$. The row may contain more than five latches 118; the existence of additional latches is indicated by three dots at the left side of each row. Cycle 0 represents a point in time just prior to readout of the latched values. As shown in the top row of FIG. 5 (labeled cycle 0), each latch contains a single bit value. At the end of the first clock cycle, the values in each latch are shifted on place to the right, and the rightmost latched value is read out and stored. At the end of the second clock cycle, the latched values are again shifted one place to the right, and the rightmost value concatenated to the previously-stored value. The readout continues until all latches in the row have been read and the latched values stored (labeled cycle n). Simultaneously reading all rows of the array in this fashion, an entire column of pixel values is read during each clock cycle, and an image from a 20 by 20 array is scanned in 18 clock cycles (assuming no values are latched for pixels located at the array edges). Although this represents one possible manner of data readout, other methods and configurations are also within the scope of the invention.

Figure 6:
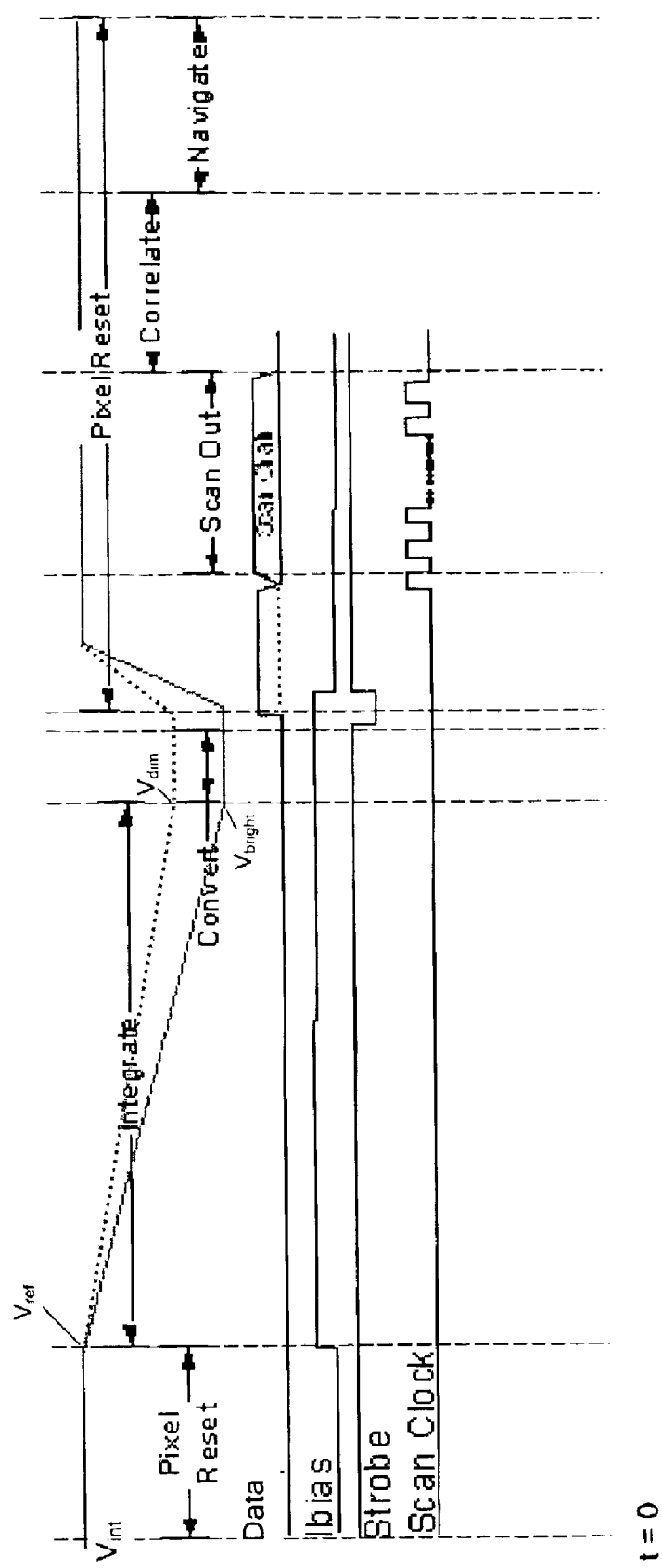
FIG. 6 is a timing diagram illustrating operation of an embodiment of the invention.

FIG. 6 is a timing diagram for the operation of a non-edge pixel $100_i$ in array 100. The pixel operation includes four stages: Reset, Integrate, Convert and Serial Out. FIG. 6 also shows "Correlate" and "Navigate" stages. These stages refer to correlation of pixel image data with previous image data and to calculation of movement based on that correlation. In the described embodiment, correlation and navigation are performed outside of pixel array 100, and are not further described herein. The first line of FIG. 6, labeled $V_{int}$, reflects the voltage at node A for pixel $100_i$. The second line, labeled Data, reflects the value latched by pixel $100_i$ for a given image after comparison with signals received from neighboring pixels (the neighboring pixel signal values are not shown in FIG. 6). The "$I_{bias}$" line of FIG. 6 indicates whether a bias current is applied to NMOS 140, and the "Strobe" line indicates whether the STROBE signal is high or low. The "Scan Clock" line indicates when values of the latches 118 are read for each column of pixels. The latched value (latch $118_i$) for pixel $100_i$ would be read at the clock cycle corresponding to the column in which pixel $100_i$ is located. For example, if pixel $100_i$ is pixel $100_3$ in FIG. 3, the latch $118_3$ for pixel $100_3$ would be read on the same clock cycle as the latches $118_1$ and $118_2$ for pixels $100_1$ and $100_2$.

At t=0 in FIG. 6, the pixel is already in the Reset stage. During Reset, the voltage $V_{int}$ at node A for each pixel (including edge pixels) is pulled to a common reference voltage $V_{ref}$ by operation of devices 132 and 134. During the Reset stage, signal RESET is high, preventing current flow through PMOS 134, while signal NRESET is low, permitting current flow through PMOS 132. PMOS devices 132 and 134 provide charge cancellation circuitry to cancel unwanted charge injected into Node A. Although neighboring pixels should have matching optical and electrical performance characteristics, charge cancellation circuitry helps to reduce fixed pattern noise (FPN) caused by potential mismatches of charge amounts injected into neighboring cells.

In the Integration stage, the signal RESET goes low, the NRESET signal goes high, and a light source is enabled. The light source may be a Light Emitting Diode (LED) or other selectively enabled light source positioned to reflect light from a desk top or other surface into array 100. The $I_{bias}$ signal is high, thereby permitting initial current $I_0$ to flow through NMOS devices 140, 138 and 142. As shown in FIG. 6, $I_{bias}$ may be disabled during the Reset stage to conserve power. Because light intensity is not measured when the array is in the Reset stage, there is no need to modulate a value of $I_0$ based on $V_{ref}$, and $I_{bias}$ may be disabled to conserve power. Alternatively, $I_{bias}$ could remain enabled. As light impinges upon photodiode 136, the current through photodiode 136 discharges integration node A, causing $V_{int}$ to drop. As shown in FIG. 6, $V_{int}$ ramps downward during the Integration stage. The slope of that ramp corresponds to the rate at which Node A discharges, which in turn corresponds to the magnitude of the reverse bias current through illuminated photo-diode 136. Because the current through photodiode 136 increases with increased illumination, the slope of the $V_{int}$ ramp varies with the intensity of light falling on photodiode 136.

The light source is disabled at the end of the Integration stage. Because the dark current (i.e., reverse bias current in the absence of illumination) through photodiode 136 is sufficiently minimal, $V_{int}$ remains at the level reached at the end of the Integration stage. As seen in FIG. 6, this level corresponds to the bottom of the voltage ramp. FIG. 6 shows two voltage ramps. The solid line ramp corresponds to a voltage drop associated with more intense (or "bright") illumination of photodiode 136, and may indicate the presence of a reflective (or more reflective) object or surface feature. A higher current through photodiode 136 discharges Node A quickly, resulting in a steeper ramp. Conversely, the broken-line ramp corresponds to a voltage drop associated with less intense (or "dim") illumination of photodiode 136, and may indicate the absence of a reflective (or a less reflective) object or surface feature. A lower current through photodiode 136 discharges Node A more slowly, and results in a less steep ramp. Because the voltage $V_{int}$ on Node A biases the gate of NMOS 138, the magnitude of $V_{int}$ modulates the magnitude of $I_0$. A larger $V_{int}$ therefore results in a larger $I_0$, while a smaller $V_{int}$ results in a smaller $I_0$. $V_{int}$ (and thus, $I_0$) may continue to fall throughout the Integration stage. So long as current $I_0$ flows, comparison currents may be generated by the comparison current generator. When the light source is disabled at the end of the Integration stage, and because of the low dark current through the photodiode, the magnitude of $I_0$ at the time the light is disabled (i.e., the end of the Integration stage) stops falling, and the corresponding comparison current magnitudes also stop falling.

The Conversion stage follows the Integration stage. At the end of the Integration stage, one input into comparator $116_i$ of pixel $100_i$ is the 8× comparison current from the pixel's comparison current generator. This comparison current thus corresponds to 8× the magnitude of that pixel's $I_0$ at the end of the Integration stage (i.e., when the light is disabled). Using the solid $V_{int}$ line from FIG. 6 and the schematic diagram of FIG. 4 as an example, an internal current equal to eight times the $I_0$ corresponding to $V_{bright}$ is input to node B from PMOS 147. The sum of eight external comparison currents from the comparison current generators of neighboring pixels are input to node C. The current at node C thus corresponds to the sum of magnitudes of the $I_0$ currents from the eight neighboring pixels at the end of the Integration stage. With the STROBE signal high, the comparator $116_i$ is held in a balanced state. Near the end of the Conversion stage, the STROBE signal goes low, NMOS device 158 turns off, and the relative magnitude of the inputs to nodes B and C are compared. If the input to Node B is greater, the summed external currents are grounded through NMOS device 156, and the voltage at node C is low. If, however, the node B input is lower than the node C input, the summed currents are not completely grounded, and the voltage at node C remains high.

When the STROBE signal is low, the voltage at node C latches a "0" or "1" at latch $118_i$. FIG. 6 shows a high value on the Data line when the Strobe signal is low, resulting in latching of a "1" in the latch $118_i$ for pixel $100_i$. It is important to note, however, that the high value for pixel $100_i$ shown on the Data line in FIG. 6 is not based merely on the brightness of the illumination of the single pixel $100_i$. Instead, that Data line value (high or low) is based on a comparison of the internal current signal within pixel $100_i$ corresponding to $V_{bright}$ with current signals provided by other pixels. If enough of those other pixels were also illuminated such that their respective integration node voltages were sufficiently near $V_{bright}$, the Data line value for pixel $100_i$ might well be low (thus latching a "0"). The latched value thus represents a DCRed value of a single pixel (e.g., Pixel $100_0$ in FIGS. 2 and 3) in comparison to neighboring pixels in a sub-array. In other words, the latched value represents the relative magnitude of illumination upon a pixel in comparison to the illumination of neighboring pixels.

Once the conversion is complete and the DCRed value of each pixel is latched, the latched values may be read as described above. As shown in FIG. 6, a scan clock signal (which may function as a read-out signal) may be transmitted to simultaneously read a column from each row prior to the Correlate and Navigate functions.

By performing the DCR image processing in the analog domain and integrating it within the pixel array, digital signal interference into the analog and photo sensitive regions of the array can be reduced.

Additional Embodiments

Figure 7:
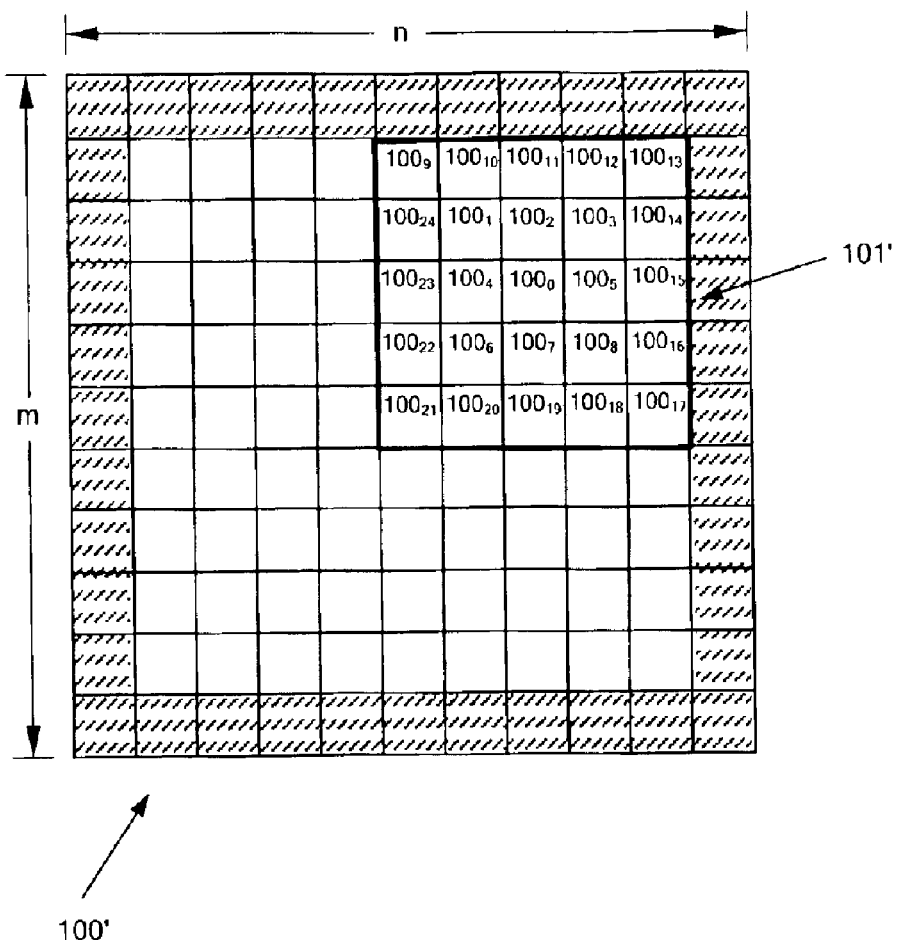
FIG. 7 is a block diagram of a pixel array according to another embodiment of the invention.

In the previous described embodiments, each pixel (or at least each non-edge pixel) compares its output with the outputs of its nearest neighbors. However, other embodiments include comparison of a pixel output with output from non-contiguous (or "non-nearest") neighbor pixels. By way of example, FIG. 7 shows an array 100' and subarray 101'. Expression 1 can be modified as follows:

Expression 2:

$$S(100_0) > \frac{\alpha_1 S(100_1) + \alpha_2 S(100_2) + \alpha_3 S(100_3) + \alpha_4 S(100_4) + \alpha_5 S(100_5) + \alpha_6 S(100_6) + \ldots + \alpha_{24} S(100_{24})}{\alpha_0}$$

which can alternatively be written as:

$$S(100_0) > \frac{\sum_{i=1}^{24} a_i S(100_i)}{\alpha_0}$$

Pixels in an array implementing Expression 2 may, but need not necessarily, contain additional mirroring devices (such as PMOS devices 143-51 in FIG. 4) if more than eight neighboring pixel output signals are summed. Of course, additional mirroring devices would not be required if $\alpha_i = 0$ for a sufficient number of terms in Expression 2. In other embodiments, Expression 2 could be further modified so as to encompass sub-arrays of other dimensions, as set forth in Expression 3:

Expression 3:

$$S(100_0) > \frac{\sum_{i=1}^{n} a_i S(100_i)}{\alpha_0}$$

where n=the number of neighboring pixels to be considered.

Figure 8:
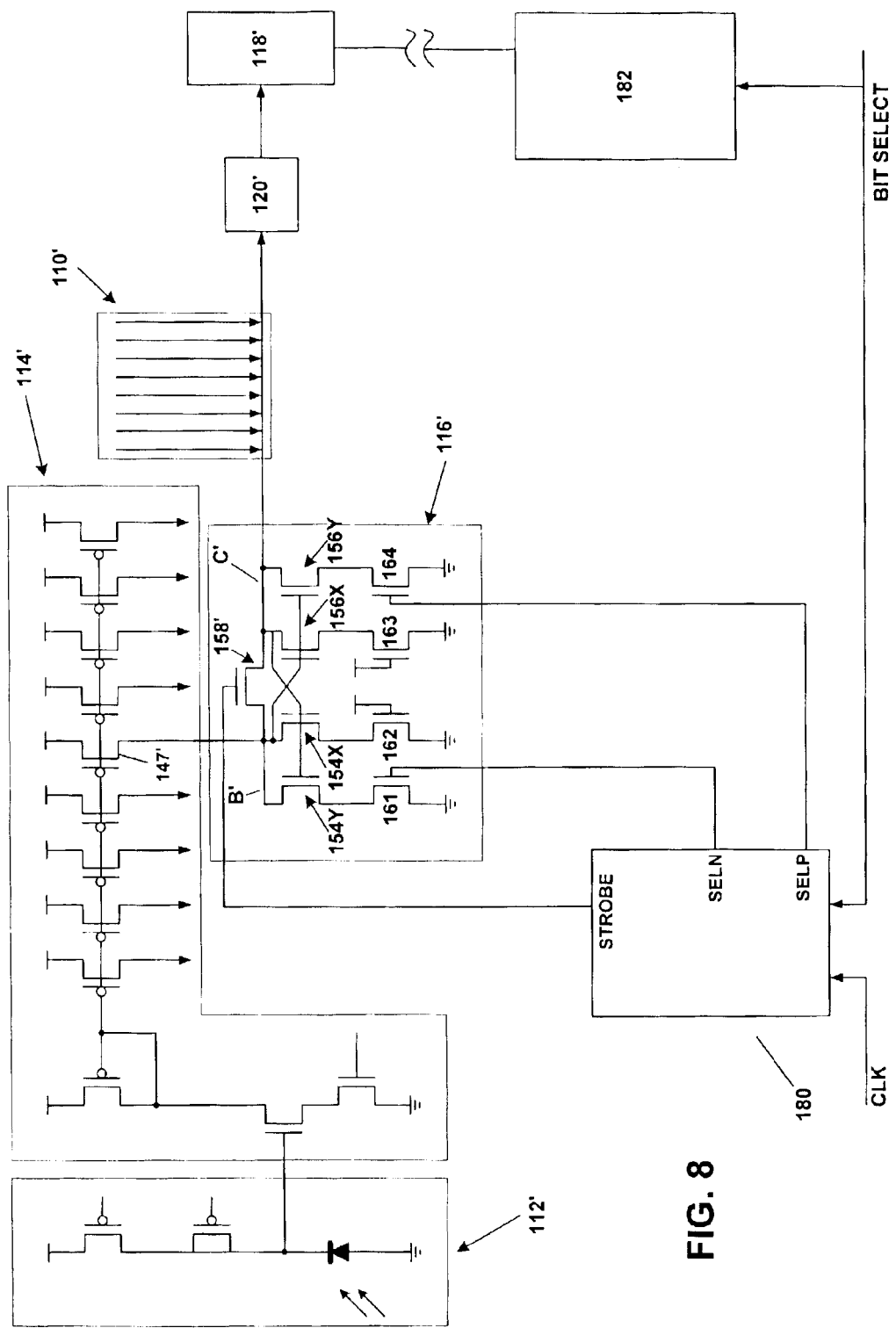
FIG. 8 is a schematic diagram of a pixel according to another embodiment of the invention.

In still other embodiments, one or more pixels may be configured to output more than a single bit of image data during an imaging cycle. FIG. 8 is a schematic diagram for a pixel of one such embodiment. The integration circuitry 112', comparison current generator circuitry 114' and current summing node 110' are similar to the integration circuitry 112, comparison current generator circuitry 114 and current summing node 110 described with regard to FIG. 4. Accordingly, the details and operation of blocks 110', 112' and 114' need not be further described. However, the comparator 116' in FIG. 8 has been modified to include multiple devices 154X and 154Y on node B' and multiple devices 156X and 156Y on node C'. Devices 154X and 154Y are of different sizes, but devices 154X and 156X are matched. Devices 154Y and 156Y are also matched. Current through device 154X is regulated by device 162. Similarly, currents through devices 154Y, 156X and 156Y are respectively regulated by devices 161, 163 and 164. Processor 180 (which may be local, or which may be global or otherwise provide control signals to multiple pixels) controls devices 161 and 164 with signals SELP and SELN. Processor 180 similarly provides the STROBE signal, and receives clock (CLK) and bit selection (BIT SELECT) signals.

The Reset and Integration stages of an imaging cycle for the pixel of FIG. 8 would generally be similar to those described above with regard to FIGS. 4 and 6. As with the previously-described embodiment, the input to node B' is the 8× magnitude current ($I_{8\times}$) from device 147' and the input to comparator node C' is the sum of comparison currents ($I_\Sigma$) from neighboring pixels. Unlike the previous embodiment, however, the inputs to comparator 116' are compared several times during a Conversion stage of an imaging cycle. In the first comparison, the SELP signal is high, and device 164 is turned on. In this state, current can flow from node C' through devices 156X and 156Y, and from node B' through device 154X. If the devices 156X and 156Y are sized such that the total size of devices 156X and 156Y is larger than the size of device 154X, comparator 116' will be skewed toward node B'. In other words, a greater $I_\Sigma$ will be needed for the comparator output to be high. After the STROBE signal goes low, the output of comparator 116' is latched by latch 118', and then possibly stored in memory 182 (as described below); memory 182 is external to the pixel. The STROBE signal is again brought high to balance comparator 116', and the SELN and SELP signals brought low. In this state, current can flow from node C' through device 156X and from node B' through device 154X. Because these devices are balanced, the output of comparator 116' will be high when $I_\Sigma$ is equal to or greater than $I_{8x}$. The STROBE signal is again brought low, the output of comparator 116' latched, and the latched value (possibly) stored in memory 182. The STROBE signal is then brought high to balance comparator one more time, and the SELN signal is brought high. In this state, current can flow from node C' through devices 156X and from node B' through devices 154X and 154Y. In this state, comparator 116' is skewed toward node C'. In other words, a lesser $I_\Sigma$ will be needed to bring the comparator output high. The STROBE signal is again brought low, the output of comparator 116' latched, and the latched value (possibly) stored in memory 182.

Figure 9:
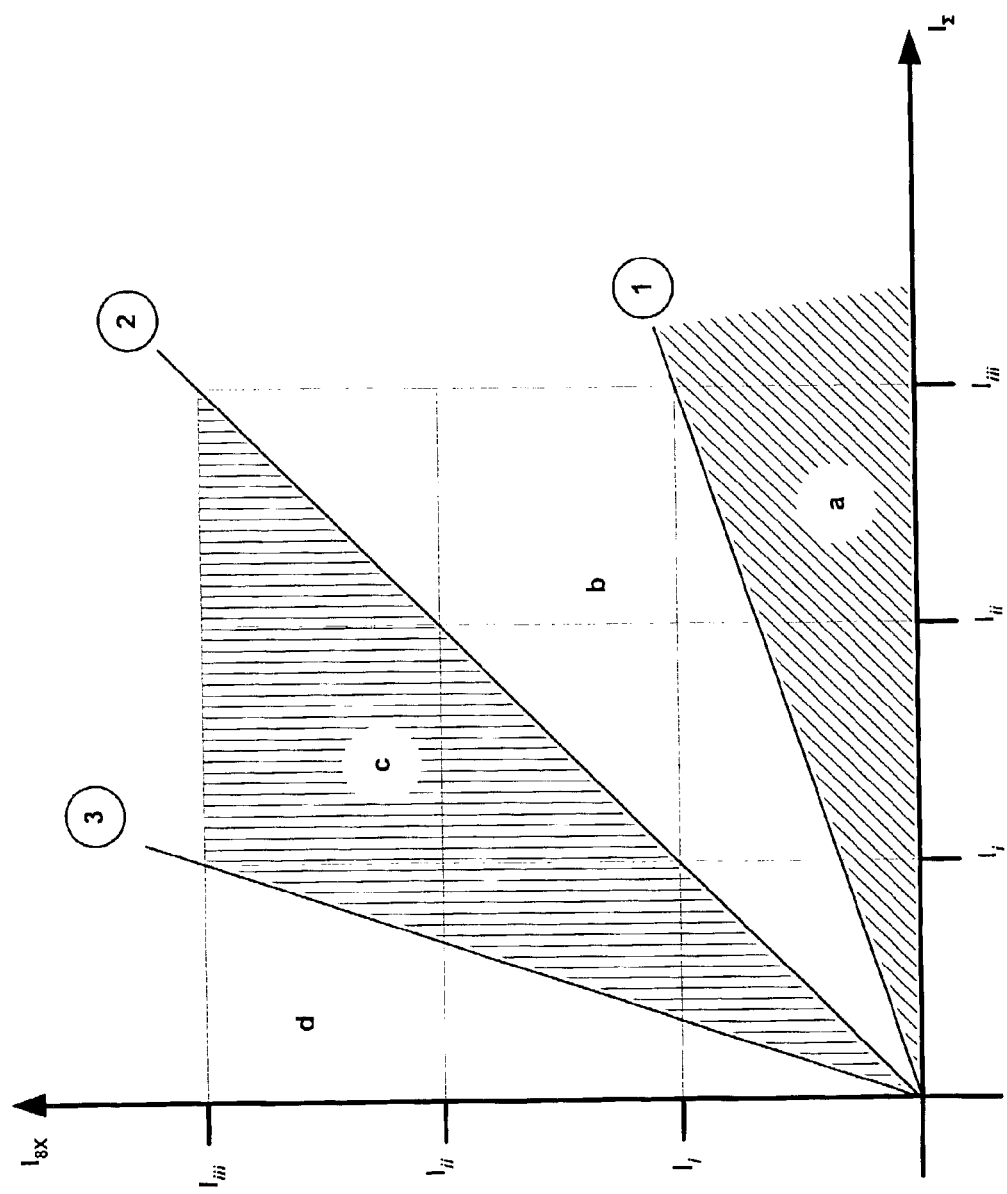
FIG. 9 is a graph explaining operation of the pixel of FIG. 8.

FIG. 9 is a graph that further explains the operation of comparator 116'. The horizontal axis represents the input to node C' ($I_\Sigma$), and the vertical axis represents the input to node B' ($I_{8x}$). $I_i$, $I_{ii}$ and $I_{iii}$ represent arbitrary current magnitudes such that $|I_{iii}|>|I_{ii}|>|I_i|$. Line 1 corresponds to the SELP signal being high (devices 154X, 156X and 156Y turned on). For combinations of $I_\Sigma$ and $I_{8x}$ values above line 1, the output of comparator 116' is low. For combinations of $I_\Sigma$ and $I_{8x}$ values on or below line 1, the output of comparator 116' is high. Line 2 corresponds to SELP and SELN being low (devices 154X and 156X turned on). When comparator 116' is in this state, combinations of $I_\Sigma$ and $I_{8x}$ values above line 2 yield a low comparator output, and combinations of $I_\Sigma$ and $I_{8x}$ values on or below line 2 yield a high comparator output. Line 3 corresponds to the SELN signals being high (devices 154X, 154Y and 156X turned on). When comparator 116' is in this state, combinations of $I_\Sigma$ and $I_{8x}$ values above line 3 yield a low comparator output, and combinations of $I_\Sigma$ and $I_{8x}$ values on or below line 3 yield a high comparator output. In this configuration, comparator 116' can thus provide an output that is more indicative of the magnitude by which $I_\Sigma$ exceeds $I_{8x}$, or by which $I_{8x}$ exceeds $I_\Sigma$. Referring again to FIG. 9, the pixel can provide outputs which can be decoded into an indication of which of the four regions (a, b, c or d) $I_\Sigma$ and $I_{8x}$ lie.

Processor 180 and memory 182 convert the output of comparator 116' into a 2-bit value. During the first portion of portion of the conversion stage (STROBE goes low, SELP is high), a high comparator output (indicating $I_\Sigma$ and $I_{8x}$ in region a) is stored in external memory 182 as a "11." Because a low output is consistent with $I_\Sigma$ and $I_{8x}$ being in region b, c or d, no value is stored for a low output during the first portion. During the second portion of the conversion stage (STROBE goes low, SELN and SELP are low), a high comparator output indicates values of $I_\Sigma$ and $I_{8x}$ in region b, and is stored in memory 182 as a "10." Because a low output is consistent with $I_\Sigma$ and $I_{8x}$ being in region c or d, no value is stored for a low output during the second portion. During the third portion of the conversion stage (STROBE goes low, SELN is high), a high comparator output is stored in external memory 182 as a "01," and a low comparator output is stored as a "00." Additional bit values may be obtained with additional devices similar to 154Y and 156Y and additional select outputs from 180.

Figure 10:
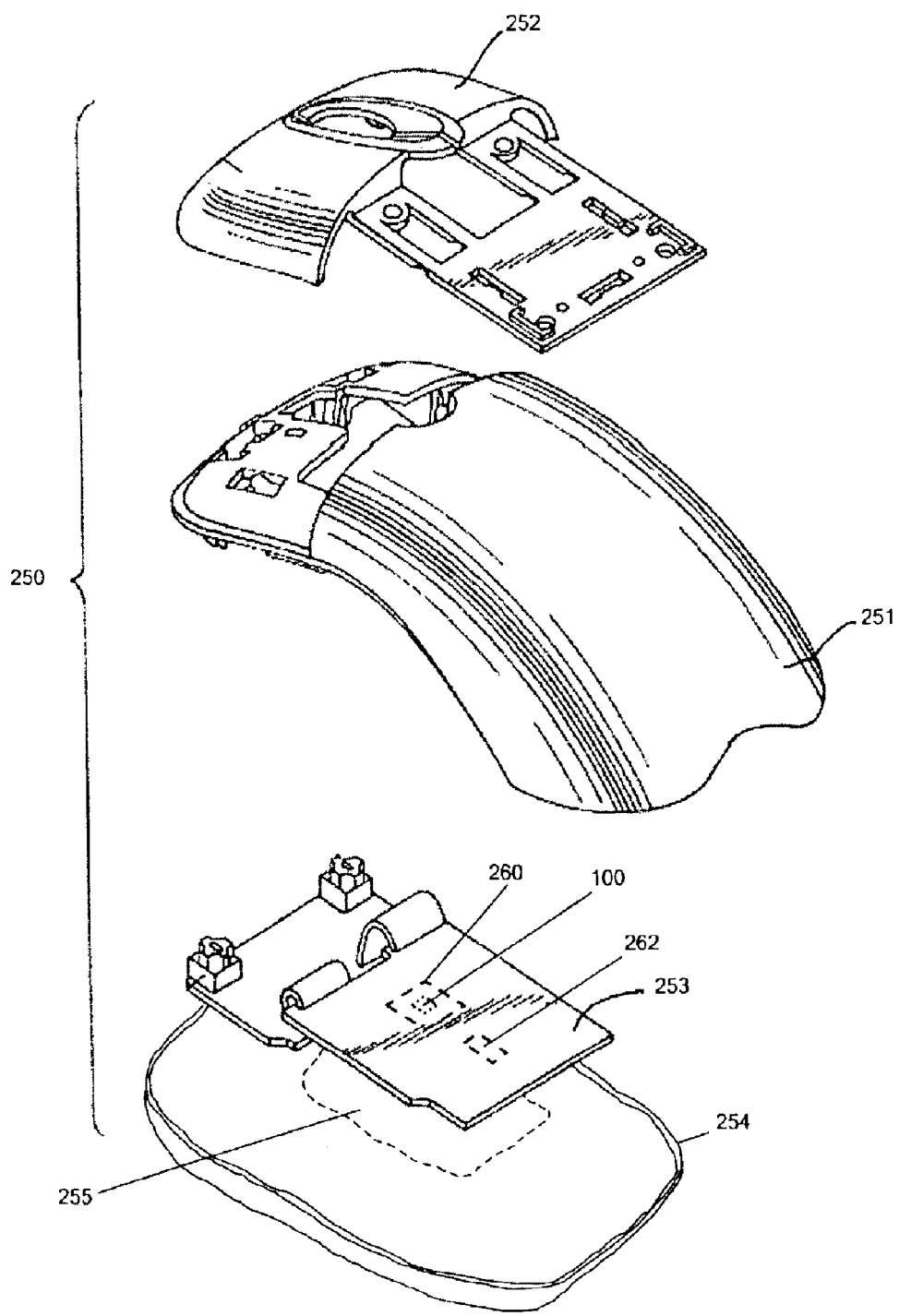
FIGS. 10 and 11 show one implementation of a pixel array according to the invention in a computer mouse.
Figure 11:
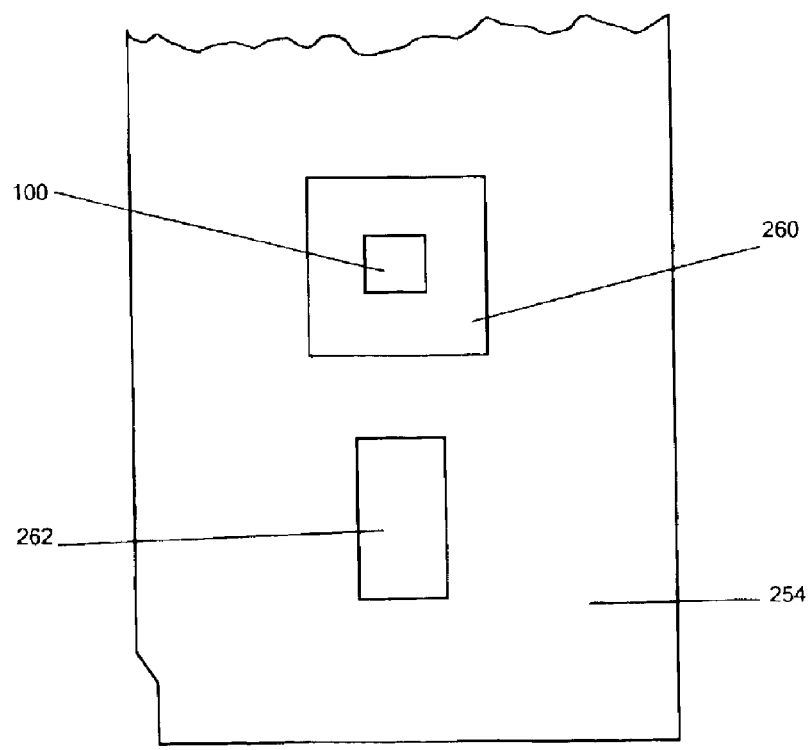

An array of pixels according to the invention can be used for motion detection, and more specifically, as part of a computer input or pointing device. Such devices include computer mice, trackballs and other devices which measure movement. FIG. 10 shows an example of one possible implementation in a computer mouse of an array of photosensor pixels according to the invention. Illustrated in FIG. 10, in an "exploded" perspective view, are several major components of a typical mouse 250. Mouse 250 includes an upper case 251, a set of keys 252, a circuit board 253, and a lower case 254. Other components of mouse 250 are not shown, but could include a power source (for battery powered mice), a cable for communication with a computer (if not a wireless device), a scroll wheel and other mechanical components; and various circuit components. These other components are known in the art and their illustration is not required for an understanding of the invention. As is known in the art, a user operates mouse 250 by moving mouse 250 over a desk or other surface. The underside of lower case 254 is in contact with the desk or other surface, and is either transparent or includes a transparent portion 255. A lens or other focusing element (not shown) could also be located between the transparent portion 255 and circuit board 253, or incorporated into transparent portion 255. Located on the underside of circuit board 253 are an imaging chip 260 (shown in outline in FIG. 10) and a LED 262 (also shown in outline in FIG. 10). In operation, light from LED 262 reflects from a desk or other surface, shines through transparent region 255 (and a focusing element, if present), and is received by array 100 located on chip 260. As shown in FIG. 11, which is a partial view of the underside of circuit board 253, array 100 could be incorporated into imaging chip 260.

Although specific examples of carrying out the invention have been described, those skilled in the art will appreciate that there are numerous variations and permutations of the above described systems and techniques that fall within the spirit and scope of the invention as set forth in the appended claims. As but one example, the initial current generator, comparison current generator and comparator (as well as other portions of the described embodiments) could be formed from alternative circuit configurations. Pixels of an array according to the invention could include photo-sensors that respond to illumination outside of visible light wavelengths. In addition to configurations wherein one or more non-contiguous neighboring pixels is in communication with a given pixel, the invention includes configurations wherein less than all contiguous (or nearest neighboring) pixels are in communication with a given pixel.

The pixel array of the invention might also be implemented in other applications. One example includes motion detection for alarm purposes. Yet another example includes incorporation of the pixel array into an electronic "ruler" or "yardstick" used to measure distance. Another possible example includes use of the pixel array as part of a paper motion sensor in a printer. These and other modifications are within the scope of the invention as defined by the attached claims.

What is claimed is:
1. An image sensor array, comprising:
    a first plurality of pixels, each pixel having:

a photo-sensor responsive to electromagnetic illumination, an initial signal generator, in electrical communication with the photo-sensor, for generating an initial signal corresponding to illumination of the photo-sensor, a comparison signal generator configured to produce multiple outbound comparison signals based on the initial signal and to produce at least one internal comparison signal based on the initial signal, a summing node electrically connected to comparison signal generators of neighboring pixels, electrical connections between the comparison signal generator and neighboring pixels by which the multiple outbound comparison signals may be provided to the neighboring pixels, and a comparator having the internal comparison signal as a first input and a summing node signal from said summing node as a second input, and providing an output signal indicating a relative difference in pixel illumination.

2. The image sensor array of claim 1 wherein, for each pixel of the first plurality of pixels:

the photo-sensor allows discharge of a first voltage when exposed to electromagnetic illumination, the initial signal comprises an initial current having a magnitude regulated by the magnitude of the first voltage, and the comparison signal generator is configured to produce multiple outbound comparison currents and at least one internal comparison current.

3. The image sensor array of claim 2, wherein each pixel of the first plurality of pixels further comprises a latch in communication with the comparator and configured to latch a first value if the first comparator input exceeds the second comparator input, and to latch a second value if the second comparator input exceeds the first comparator input.

4. The image sensor array of claim 2 wherein, for each pixel of the first plurality of pixels, the multiple outbound comparison currents have a first value of gain or attenuation and the at least one internal comparison current has a second value of gain or attenuation.

5. The image sensor array of claim 4, wherein for each pixel of the first plurality of pixels, the first value of gain or attenuation is the same and the second value of gain or attenuation is the same.

6. The image sensor array of claim 4, wherein the second value of gain or attenuation is a multiple of the number of external comparison currents received at the summing node.

7. The image sensor array of claim 3, wherein the pixels are arranged in an array of m rows and n columns, and wherein the array is configured such that multiple latches in a column are read simultaneously.

8. The image sensor array of claim 2, wherein:

the comparator provides a first comparator output signal if one of the first and second inputs exceeds a comparison percentage of the other of the first and second inputs, and the comparator is configured such that, upon receipt of a set of control signals, the comparison percentage is changed.

9. The image sensor array of claim 2, wherein the initial current is not continuously generated when the pixel array is in operation.

10. The image sensor array of claim 2, further comprising a second plurality of pixels located on edges of the array, and wherein each pixel of the second plurality of pixels has:

a photo-sensor responsive to electromagnetic illumination, wherein the photo-sensor allows discharge of a photo-sensor voltage when exposed to electromagnetic illumination, an analog initial signal generator in electrical communication with the photo-sensor, wherein the analog initial signal comprises an analog initial current having a magnitude regulated by the magnitude of the photo-sensor voltage, an analog comparison current generator to produce multiple outbound comparison currents based on the analog initial current, and connections between the analog comparison current generator and neighboring pixels, wherein the multiple outbound comparison currents generated by the analog comparison current generator are provided to said multiple neighboring pixels, and wherein each pixel in the second plurality is configured so as not to compare an analog internal comparison current with summed external comparison currents.

11. The image sensor array of claim 2, wherein the array is part of a single integrated circuit.

12. The image sensor array of claim 2, wherein, for each pixel of the first plurality of pixels, the photo-sensor is a photodiode and the initial signal generator comprises a transistor biased by the first voltage.

13. The image sensor of claim 2, wherein:

the summing node is electrically connected to the comparison signal generator of at least one non-contiguous pixel, and the electrical connections between the comparison signal generator and neighboring pixels include at least one electrical connection to a non-contiguous pixel.

14. The image sensor of claim 8, wherein:

the summing node is electrically connected to the comparison signal generator of at least one non-contiguous pixel, and the electrical connections between the comparison signal generator and neighboring pixels include at least one electrical connection to a non-contiguous pixel.

15. A computer input device for generating a cursor movement on a computer display in response to a corresponding movement of a surface relative to the input device, comprising:

an illumination source positioned to illuminate the relatively moving surface; and an image sensor array, the array positioned to receive reflected illumination from the relatively moving surface and having a first plurality of pixels, each pixel of the first plurality of pixels having:

a photo-sensor responsive to electromagnetic illumination, an initial signal generator, in electrical communication with the photo-sensor, for generating an initial signal corresponding to illumination of the photo-sensor, a comparison signal generator configured to produce multiple outbound comparison signals based on the initial signal and to produce at least one internal comparison signal based on the initial signal, a summing node electrically connected to comparison signal generators of neighboring pixels, electrical connections between the comparison signal generator and neighboring pixels by which the multiple outbound comparison signals may be provided to the neighboring pixels, and a comparator having the internal comparison signal as a first input and a summing node signal from said summing node as a second input, and providing an output signal indicating a relative difference in pixel illumination.

16. The computer input device of claim 15 wherein, for each pixel of the first plurality of pixels:
the photo-sensor allows discharge of a first voltage when exposed to electromagnetic illumination,
the initial signal comprises an initial current having a magnitude regulated by the magnitude of the first voltage, and
the comparison signal generator is configured to produce multiple outbound comparison currents and at least one internal comparison current.

17. The computer input device of claim 16, wherein each pixel of the first plurality of pixels further comprises a latch in communication with the comparator and configured to latch a first value if the first comparator input exceeds the second comparator input, and to latch a second value if the second comparator input exceeds the first comparator input.

18. The computer input device of claim 16 wherein, for each pixel of the first plurality of pixels, the multiple outbound comparison currents have a first value of gain or attenuation and the at least one internal comparison current has a second value of gain or attenuation.

19. The computer input device of claim 18, wherein for each pixel of the first plurality of pixels, the first value of gain or attenuation is the same and the second value of gain or attenuation is the same.

20. The computer input device of claim 16, wherein the pixels are arranged in an array of m rows and n columns, and wherein the array is configured such that multiple latches in a column are read simultaneously.

21. The computer input device of claim 16, wherein:
the comparator provides a first comparator output signal if one of the first and second inputs exceeds a comparison percentage of the other of the first and second inputs, and
the comparator is configured such that, upon receipt of a set of control signals, the comparison percentage is changed.

22. The computer input device of claim 16, wherein the initial current is not continuously generated when the pixel array is in operation.

23. The computer input device of claim 16, wherein the image sensor array further comprises a second plurality of pixels located on edges of the array, and wherein each pixel of the second plurality of pixels has:
a photo-sensor responsive to electromagnetic illumination, wherein the photo-sensor allows discharge of a photo-sensor voltage when exposed to electromagnetic illumination,
an analog initial signal generator in electrical communication with the photo-sensor, wherein the analog initial signal comprises an analog initial current having a magnitude regulated by the magnitude of the photo-sensor voltage,
an analog comparison current generator to produce multiple outbound comparison currents based on the analog initial current, and
connections between the analog comparison current generator and neighboring pixels, wherein the multiple outbound comparison currents generated by the analog comparison current generator are provided to said multiple neighboring pixels, and wherein each pixel in the second plurality is configured so as not to compare an analog internal comparison current with summed external comparison currents.

24. The computer input device of claim 16, wherein the array is part of a single integrated circuit.

25. The computer input device of claim 16, wherein, for each pixel of the first plurality of pixels, the photo-sensor is a photodiode and the initial signal generator comprises a transistor biased by the first voltage.

26. A method of indicating a relative difference in illumination of pixels within an image sensor array, comprising:
for each pixel in a first plurality of pixels within the array, the steps of:
illuminating the pixel;
generating an initial signal corresponding to the illumination of the pixel;
generating, based on the initial signal, multiple outbound comparison signals and at least one internal comparison signal;
receiving outbound comparison signals generated in neighboring pixels;
summing the received outbound comparison signals generated in said neighboring pixels so as to form a summed signal;
comparing the summed signal with the internal comparison signal; and
providing an output signal indicating a relative difference in pixel illumination.

27. The method of claim 26, wherein:
said step of generating an initial signal comprises generating an initial current having a magnitude regulated by a first voltage, the first voltage being discharged by illumination of a photo-sensor within the pixel; and
said step of generating multiple outbound comparison signals and at least one internal comparison signal comprises generating multiple outbound comparison currents and at least one internal comparison current.

28. The method of claim 27, further comprising the step of storing a first value if the summed signal exceeds the internal comparison signal, and storing a second value if the internal comparison signal exceeds the summed signal.

29. The method of claim 27, wherein said step of generating multiple outbound comparison signals comprises generating multiple outbound currents having a first value of gain or attenuation, and wherein said step of generating at least one internal comparison signal comprises generating at least one internal comparison current having a second value of gain or attenuation.

30. The method of claim 29, wherein the first value of gain or attenuation is the same for all pixels of the first plurality, and wherein the second value of gain or attenuation is the same for all pixels of the first plurality.

31. The method of claim 29, wherein the second value of gain or attenuation is a multiple of the number of comparison currents summed within the pixel.

32. The method of claim 27, further comprising the step of discontinuing generation of the initial current during a portion of an imaging cycle when the initial current is not needed.

33. The method of claim 32, further comprising:
for each pixel in a second plurality of pixels within the array the steps of:
illuminating the pixel;
generating an initial current corresponding to illumination of the pixel; and
generating multiple outbound comparison currents based on the initial current, wherein
said summing and comparing said steps are preformed in pixels of the first plurality.

34. The method of claim 27, wherein said step of providing an output signal indicating a relative difference in pixel illumination comprises providing a first output signal if one of the summed signal and the internal comparison signal exceeds a comparison percentage of the other of the summed signal and the internal comparison signal, and comprising the further steps of:

changing the comparison percentage;

repeating the step of providing an output signal indicating a relative difference in pixel illumination; and storing a multi-bit value based the output signals provided.

35. The method of claim 27, wherein said step of receiving outbound comparison signals generated in neighboring pixels comprises receiving at least one outbound comparison signal from a non-contiguous pixel.

36. The method of claim 34, wherein said step of receiving outbound comparison signals generated in neighboring pixels comprises receiving at least one outbound comparison signal from a non-contiguous pixel.

* * * * *